United States Patent [19]
Minuhin

[11] Patent Number: 5,854,717
[45] Date of Patent: Dec. 29, 1998

[54] SELF-SYNCHRONIZATION IN A MAGNETIC RECORDING CHANNEL UTILIZING TIME-DOMAIN EQUALIZATION

[75] Inventor: Vadim B. Minuhin, Bloomington, Minn.

[73] Assignee: Seagate Technology, Inc., Scotts Valley, Calif.

[21] Appl. No.: 690,905

[22] Filed: Aug. 1, 1996

Related U.S. Application Data

[63] Continuation-in-part of Ser. No. 536,008, Sep. 29, 1995, Pat. No. 5,682,125, and a continuation-in-part of Ser. No. 593,824, Jan. 30, 1996, Pat. No. 5,650,954.

[51] Int. Cl.$^6$ .............................. G11B 5/09; G11B 5/35
[52] U.S. Cl. .............................. 360/65; 360/46; 360/51; 375/232; 375/290
[58] Field of Search .............................. 360/46, 51, 65; 375/232, 233, 290, 341

[56] References Cited

U.S. PATENT DOCUMENTS

| | | |
|---|---|---|
| 4,754,225 | 6/1988 | Minuhin . |
| 5,373,400 | 12/1994 | Kovacs et al. ............................. 360/46 |
| 5,459,757 | 10/1995 | Minuhun et al. ......................... 360/46 |
| 5,592,340 | 1/1997 | Minuhin et al. .......................... 360/65 |

*Primary Examiner*—W. R. Young
*Assistant Examiner*—Regina Y. Neal
*Attorney, Agent, or Firm*—Crowe & Dunlevy

[57] ABSTRACT

Improved self-synchronization in a sampled magnetic recording channel employing time-domain equalization. The channel includes a time-domain equalizer which filters an input, readback signal to an approximation of a selected target waveform. The equalizer includes a plurality of serially connected analog filter sections having associated tap locations, analog multipliers which multiply the tap signals present at the tap locations by tap weight signals to generate product signals and a summer which sums the product signals to generate an equalized output signal. A self-synchronization circuit, responsive to the main tap of the equalizer, synchronizes the data recovery process used by the channel with the rate of the readback signals provided to the channel. The self-synchronization circuit includes peak detection circuitry which uses the main tap signal from the equalizer, as well as the differentiated main tap signal, to detect peaks in the readback signal indicative of magnetic transitions in order to generate timing error signals used to control the generation of a channel clock by a voltage controlled oscillator. A programmable delay allows fine adjustment of the phase of the channel clock to optimize data recovery of the channel, with the programmable delay being calibrated during receipt of sector preamble signals.

13 Claims, 7 Drawing Sheets

SELF-SYNCHRONIZATION IN A MAGNETIC RECORDING CHANNEL UTILIZING TIME-DOMAIN EQUALIZATION

RELATED APPLICATIONS

This application is a continuation-in-part of U.S. patent application Ser. No. 08/536,008 now U.S. Pat. No. 5,682,125, filed Sep. 29, 1995, entitled ADAPTIVE ANALOG TRANSVERSAL EQUALIZER, issued Oct. 28, 1997 and a continuation-in-part of U.S. patent application Ser. No. 08/593,824, now U.S. Pat. No. 5,650,954, filed Jan. 30, 1996 entitled FREQUENCY AND TIME DOMAIN ADAPTIVE FILTRATION IN A SAMPLED COMMUNICATIONS CHANNEL, issued Jul. 22, 1997, both of which are assigned to the assignee of the present invention and are incorporated herein by reference.

BACKGROUND OF THE INVENTION

1. Field of the Invention

This invention relates generally to the field of magnetic recording channels and more particularly, but not by way of limitation, to improvements in self-synchronization of such channels employing time-domain equalization.

2. Discussion

Disc drives are commonly used in workstations, personal computers, laptops, and other computer systems to store large amounts of data in a form that can be made readily available to a user. In general, a disc drive comprises one or more magnetic discs that are rotated by a spindle motor at a constant high speed. The surface of each disc is divided into a series of data tracks which are spaced radially from one another across a band having an inner diameter and an outer diameter. The data tracks extends generally circumferentially around the discs and store data in the form of magnetic flux transitions within the radial extent of the tracks on the disc surfaces. Typically, each data track is divided into a number of data sectors that store fixed sized data blocks.

A head includes an interactive element such as a magnetic transducer which senses the magnetic transitions on a selected data track to read the data stored on the track, or to transmit an electrical signal that induces magnetic transitions on the selected data track to write data to the track. The head includes a read/write gap that positions the active elements of the head at a position suitable for interaction with the magnetic transitions on the data tracks of a disc as the disc rotates.

As is known in the art, each head is mounted to a rotary actuator arm and is selectively positionable by the actuator arm over a preselected data track of the disc to either read data from or write data to the preselected data track. The head includes a slider assembly having an air bearing surface that causes the head to fly over the data tracks of the disc surface due to fluid air currents caused by rotation of the disc.

Typically, several discs are stacked on top of each other and the surfaces of the stacked discs are accessed by the heads mounted on a complementary stack of actuator arms which comprise an actuator assembly. The actuator assembly generally includes head wires which conduct electrical signals from the heads to a flex circuit, which in turn conducts the electrical signals to a printed circuit board containing control electronics for the disc drive, including a magnetic recording channel used for the retrieval of the data stored on the discs of the drive.

One type of signal processing typically associated with high-density magnetic recording channels is time-domain equalization. Such equalization is used to reshape a readback signal received by the channel to an approximation of a desired target waveform in the time domain, such as used in a Partial Response, Maximum Likelihood (PRML) detection read channel. As will be recognized, reshaping the readback signal allows intersymbol interference (ISI) to be reduced and controlled, facilitating reliable sequential decoding of the digital information stored on the disc.

A second type of signal processing typically used in a magnetic recording channel is self-synchronization, which involves synchronization of the rate of data recovery with the rate of incoming readback signals, which varies as a result of the speed of the rotating disc and the radial position of the associated head. Typically, such self-synchronization is practically achieved through the use of a Phase Locked Loop (PLL) which generates clock signals for the sampling of equalized signals at appropriate moments and for the subsequent recovery of the stored data from the samples.

Practical implementations of both equalization and self-synchronization are discussed, for example, in U.S. Pat. No. 5,422,760, issued Jun. 6, 1995 to Abbott et al. and in the paper by Cidecian et al. entitled "A PRML SYSTEM FOR DIGITAL MAGNETIC RECORDING", IEEE Journal on Selected Areas in Communications, vol. 10, no. 1, January 1992. Additionally, for a detailed discussion of self-synchronization see U.S. Pat. No. 5,459,757 issued Oct. 17, 1995 to Minuhin et al., assigned to the assignee of the present invention and incorporated herein by reference.

As taught by these references, self-synchronization is derived from the equalized signal at the output of the equalizer. The basis for this approach is discussed in the paper by Mueller et al. entitled "TIMING RECOVERY IN DIGITAL SYNCHRONOUS DATA RECEIVERS", IEEE Transactions on Communications, No. 5, May 1976, pp. 516–531. It is significant to note that although the so-called "Mueller" approach to self-synchronization involves a digital synchronous communication channel and was not developed specifically for magnetic recording channels, generally all known practical analog and digital magnetic recording channels utilizing time-domain equalization use this approach.

Significant limitations, however, have been encountered in the application of the "Mueller" approach to self-synchronization in magnetic recording channels. First, the procedures for equalization and self-synchronization are interdependent; that is, to achieve optimal equalization, one needs to employ a clock having an optimal phase (for a given analog input signal), while to derive a clock with an optimal phase one needs an optimally equalized signal.

Additionally, the timing error signal for the PLL from the output of the equalizer includes both systematic timing error as well as residual equalization error that results from imperfect equalization. For certain pattern combinations, the residual equalization error can be indistinguishable from the systematic timing error, so that the PLL can be incorrectly driven out of phase (and further, for especially "bad patterns", the PLL can be made to lose lock altogether).

Further, the locking range of a sensor circuit (also referred to as a "time gradient detector") used to detect timing errors is generally relatively small so that, in a noisy environment, the PLL may be additionally prone to lose lock.

Finally, in the case of the use of digital equalization, the analog to digital converter (ADC), the equalizer, and the signal processing circuitry are inside of the PLL. The associated delays from these components result in so-called "transportation delay" or "dead time" which adversely affects the performance and stability of the PLL.

As a result of these and other limitations, there is a need for an improved approach to self-synchronization which overcomes the deficiencies of the prior art.

SUMMARY OF THE INVENTION

The present invention provides improved self-synchronization in a sampled magnetic recording channel employing time-domain equalization. The channel includes a time-domain equalizer which filters an input, readback signal to an approximation of a selected target waveform. The equalizer includes a plurality of serially connected analog filter sections having associated tap locations, analog multipliers which multiply the tap signals present at the tap locations by tap weight signals to generate product signals, and a summer which sums the product signals to generate an equalized output signal.

A self-synchronization circuit, using a selected signal path inside the equalizer, synchronizes the data recovery process used by the channel with the rate of the readback signals provided to the channel. Particularly, the self-synchronization circuit includes peak detection circuitry which uses the main tap signal from the equalizer, as well as the differentiated main tap signal, to detect peaks in the readback signal in order to generate timing error signals used to control the generation of a channel clock by a voltage controlled oscillator. A programmable delay allows fine adjustment of the phase of the channel clock to optimize data recovery of the channel, with the programmable delay being calibrated during receipt of sector preamble signals.

As a result, the timing recovery of the self-synchronization circuit is decoupled from the equalization of the readback signals, so that the equalization is performed on an already synchronized signal. Additionally, the delays associated with equalization do not affect the timing of the channel clock (PLL).

Moreover, either digital or analog data recovery (in the form of, for example, Viterbi detection) using the samples from the equalized output signal can be employed, without affecting the timing of the channel clock.

An object of the present invention is to provide robust self-synchronization in a magnetic recording channel employing time-domain equalization.

Another object is to accomplish self-synchronization utilizing relatively low-complexity and low power-consuming circuitry.

Yet another object is to provide self-synchronization in a manner such that delays associated with time-domain equalization of a readback signal do not affect the channel clock.

Still another object is to provide lock limits that are significantly greater than those used in the prior art, facilitating more reliable operation of the PLL.

Other objects, advantages and features of the present invention will be apparent from the following description when read in conjunction with the drawings and appended claims.

BRIEF DESCRIPTION OF THE DRAWINGS

FIG. 8 is a graphical representation of a simulated raw readback signal as the response to a periodic, 127-bit pseudo-random sequence of maximum length written to the disc.

DETAILED DESCRIPTION OF THE PREFERRED EMBODIMENT

Figure 1:
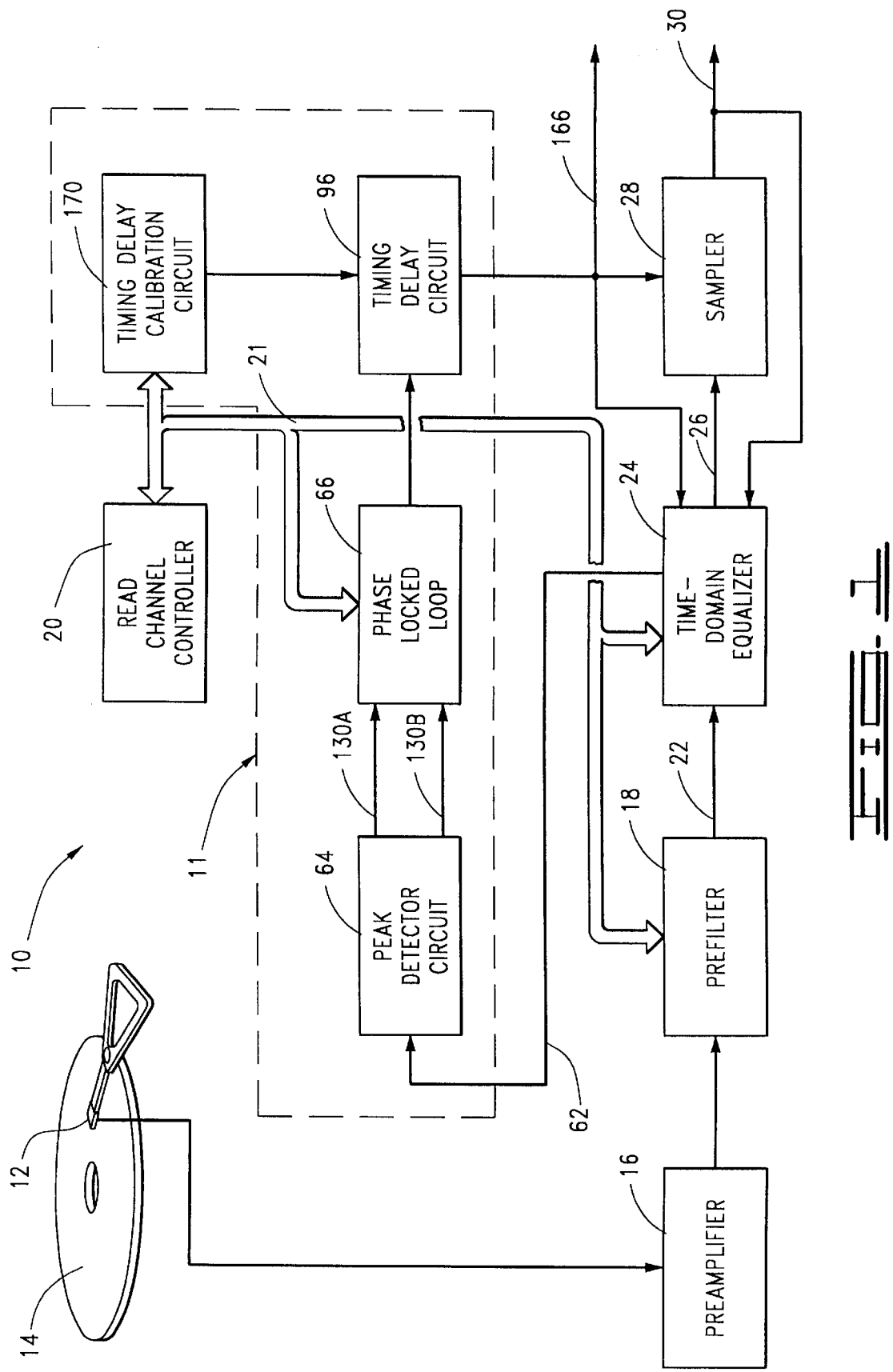
FIG. 1 is a generalized block diagram of a disc drive magnetic recording channel constructed in accordance with the preferred embodiment of the present invention.

Turning now to the drawings and more particularly to FIG. 1, shown therein is a generalized block diagram of a disc drive magnetic recording channel 10 constructed in accordance with the preferred embodiment of the present invention. For purposes of discussion, the channel 10 is contemplated as comprising a PRML read channel employing class PR-IV partial response signaling. As will be discussed in more detail hereinbelow, the channel 10 includes a self-synchronization circuit 11 (hereinafter also sometimes referred to as a "clock recovery channel") which provides self-synchronization of the channel data recovery process in accordance with the present invention.

As shown in FIG. 1, the channel 10 receives raw readback signals from a head 12 which flies in close proximity to a rotating magnetic disc 14 on which data is stored. The readback signals are amplified in a preamplifier 16 and filtered in a prefilter 18. More particularly, the prefilter 18 performs preliminary frequency-domain filtering of the readback signals and, as discussed in the previously incorporated Ser. No. 08/536,008 application, such filtering may further be adaptively controlled by prefilter parameter signals provided by a read channel controller 20 which issues several control commands on a bus 21.

Once filtered, the readback signals are provided by way of signal path 22 to a time-domain equalizer 24, wherein the signals are filtered to a close approximation of a selected target waveform (in this case class PR-IV). The equalized signal is then output on signal path 26 to a sampler 28, which outputs discrete samples of the equalized signals on signal path 30. The samples are subsequently used to reconstruct the data stored on the disc 14 using, for example, conventional Viterbi detection techniques. For purposes of clarity, the data recovery path of the channel 10 composing at least the transversal equalizer 24 and the sampler 28 will sometimes be referred to as a "data recovery channel" (not separately numerically designated in FIG. 1). Thus, the clock recovery channel is connected to and operates in parallel with the data recovery channel, as explained more fully below.

As will be discussed hereinbelow, a variety of analog constructions for the equalizer 24 can be utilized in accordance with the present invention, including equalizers employing decision feedback equalization (DFE). However, for purposes of disclosure, two different analog transversal equalizers which may be advantageously used as the equalizer 24 will be discussed, with reference to FIGS. 2 and 3.

Figure 2:
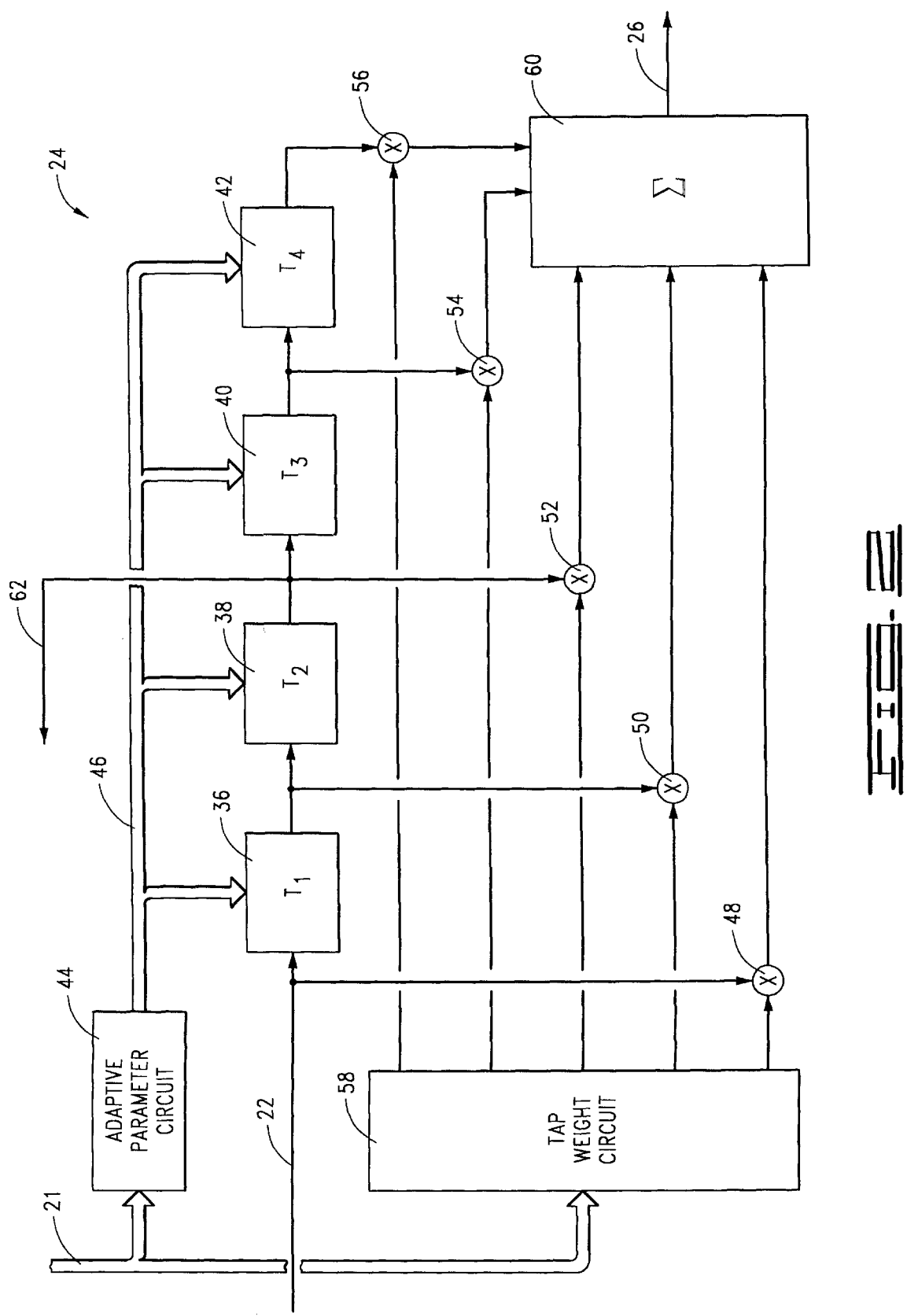
FIG. 2 is a functional block diagram of the time-domain equalizer of FIG. 1.

Beginning with FIG. 2, shown therein is a functional block diagram of the equalizer 24, comprising an analog, adaptive transversal equalizer constructed in accordance with the previously incorporated U.S. Pat. No. 5,682,125. Particularly, the equalizer 24 includes a plurality of serially connected active analog filter sections 36, 38, 40 and 42, each of which filter the input readback signals in accordance with adaptive parameters provided from an adaptive parameter circuit 44 by way of bus 46. More particularly, the filter sections 36, 38, 40 and 42 include transconductance circuits which are controlled by the adaptive parameters in the form of bias currents provided by the adaptive parameter circuit 44. The adaptive parameter circuit 44 includes digital to analog (DAC) circuitry so that the adaptive parameters are generated from digital signals provided by the read channel controller 20 by way of the bus 21.

Analog multipliers 48, 50, 52, 54 and 56 are connected at taps between the filter sections 36, 38, 40 and 42 as shown so that tap signals are multiplied by tap weight signals provided by a tap weight circuit 58. As with the adaptive parameter circuit 44, the tap weight circuit 58 includes DAC circuitry for converting digital tap weight signals from the read channel controller 20.

The outputs of the analog multipliers 48, 50, 52, 54 and 56 are summed by a summer circuit 60 to provide equalized output signals on the signal path 26. Additionally, as will be discussed in greater detail hereinbelow, FIG. 2 shows a signal path 62 to provide a main tap signal from the main tap of the equalizer 24 (between filter sections 38 and 40) to a peak detector circuit 64 of the self-synchronization circuit 11 (as shown in FIG. 1).

Figure 3:
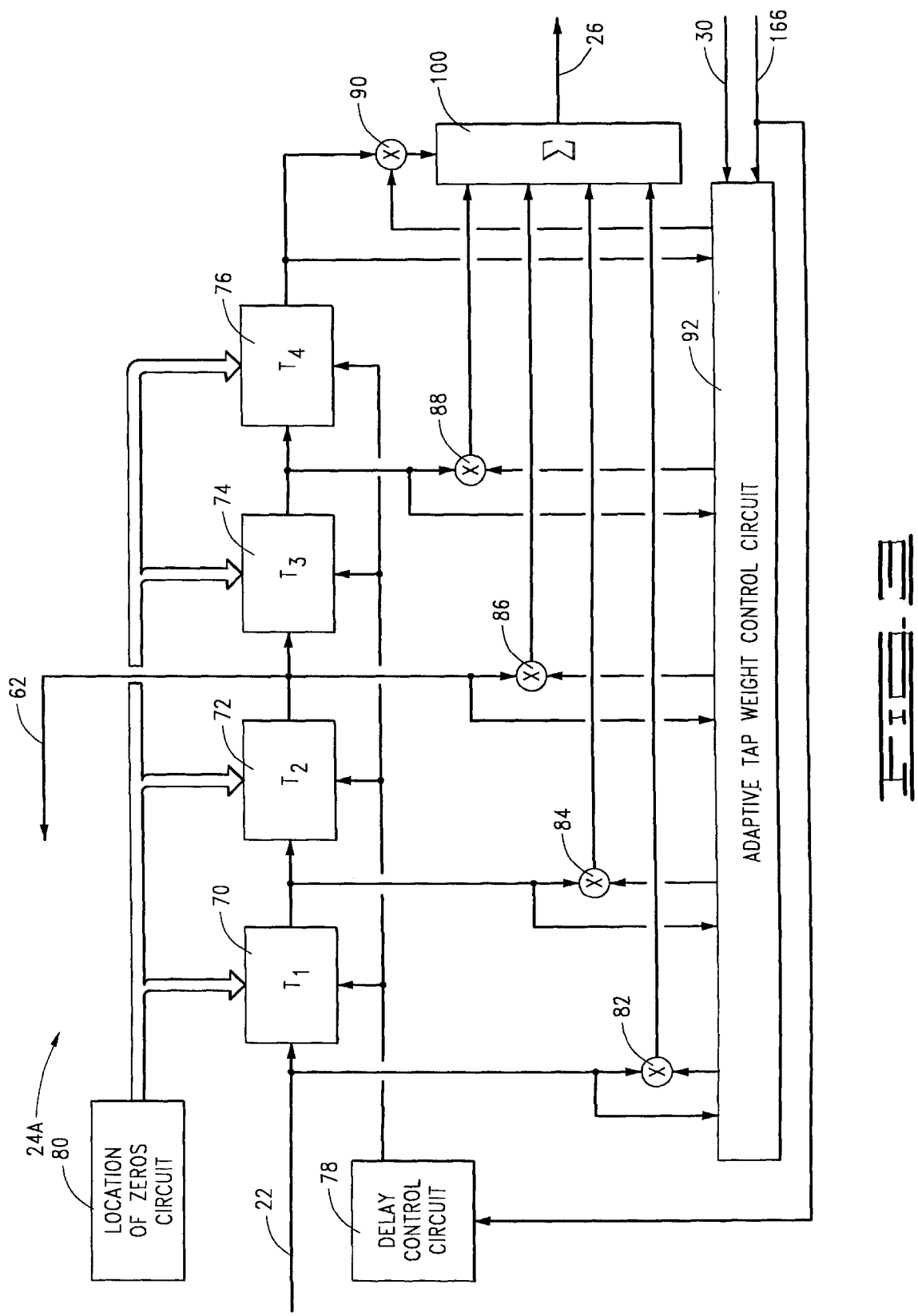
FIG. 3 is a functional block diagram of an alternative construction for the time-domain equalizer of FIG. 1.

As an alternative to the equalizer 24 shown in FIG. 2, FIG. 3 provides a double-domain equalizer (referenced as 24A in FIG. 3) constructed in accordance with the previously incorporated U.S. Pat. No. 5,650,954 application. The term "double-domain" refers to the operation of the equalizer wherein both time domain equalization occurs (as a result of the active filter sections) and frequency domain filtering (as each filter section performs controlled frequency domain filtering of the received signal). Particularly, FIG. 3 shows the equalizer 24A to comprise a plurality of serially connected active filter sections 70, 72, 74 and 76, each of which provides a one-bit delay in response to timing signals provided from a delay control circuit 78. The filtering characteristics of the filter sections 70, 72, 74 and 76 are further controlled by a location of zeros circuit 80. More particularly, the transfer function for each of the filter sections 70, 72, 74 and 76 is characterized as a quotient having a linear phase denominator and a real numerator, given as follows:

$$T(s) = \frac{K_2 s^2 + K_0 a_0}{s^4 + a_3 s^3 + a_2 s^2 + a_1 s + a_0} \quad (1)$$

with $a_0$, $a_1$, $a_2$ and $a_3$ being coefficients of a fourth-order linear equiripple phase polynomial (with 0.05 degree ripple). Thus, in controlling the constants $K_0$ and $K_2$, the location of zeros circuit 80 controls the location of zeros in the numerator of the transfer function of, and hence the frequency response of, each of the filter sections 70, 72, 74 and 76; in like manner, the delay control circuit 78 controls the denominator of the transfer function of, and hence the time delay response of, each of the filter sections 70, 72, 74 and 76.

As with the equalizer 24 of FIG. 2, the equalizer 24A of FIG. 3 further includes analog multipliers 82, 84, 86, 88 and 90 which multiply tap signals from associated tap locations between the filter sections 70, 72, 74 and 76 by tap weight signals provided by an adaptive tap weight control circuit 92. As discussed in the U.S. Pat. No. 5,650,954, the adaptive tap weight control circuit 92 adaptively adjusts the tap weights during operation of the equalizer 24A in response to the tap signals, samples provided by the sampler 28 (as shown in FIG. 1) by way of signal path 30 and sampling clock signals provided from a timing delay circuit 96 (shown in FIG. 1) by way of signal path 166. As shown in FIG. 3, the delay control circuit 78 also utilizes the signals from the signal path 166. Moreover, as with the equalizer 24 of FIG. 2, the equalizer 24A of FIG. 3 also shows the signal path 62 to connect the main tap of the equalizer 24A (between filter sections 72 and 74) to the peak detector circuit 64 (of FIG. 1).

Finally, the outputs of the analog multipliers 82, 84, 86, 88 and 90 are provided to a summer circuit 100 which, like the summer circuit 60 of FIG. 2, provides equalized output signals on the signal path 26 to the sampler 28.

Having concluded a discussion of the equalization performed by the channel 10 of FIG. 1, attention will now be directed to the self-synchronization circuit 11 of the channel 10 which, as described hereinabove, operates to match the data recovery process to the rate of input signals received by the channel 10 from the head 12 and the disc 14.

Figure 4:
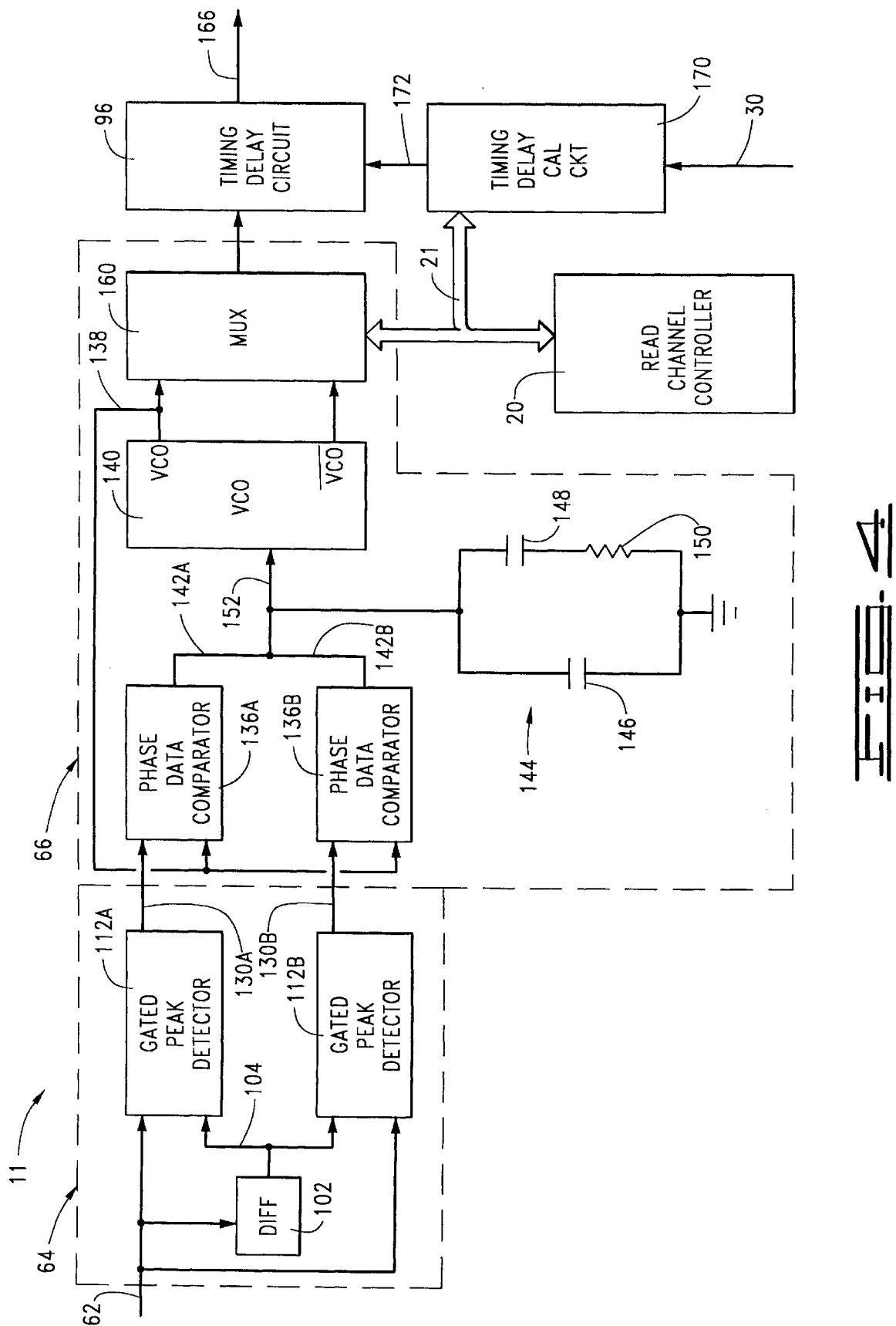
FIG. 4 is a functional block diagram of the self-synchronization circuit of FIG. 1.

Referring now to FIG. 4, shown therein is a functional block diagram of the self-synchronization portion 11 of the channel 10, comprising the peak detector circuit 64, a phase locked loop 66, the timing delay circuit 96 and a timing calibration circuit 170. The construction and operation of each of these components will be discussed hereinbelow. Additionally, FIG. 4 shows the read channel controller 20.

Beginning with the peak detector circuit 64, as shown in FIG. 4 this circuit receives the main tap signal from the equalizer 24 by way of the signal path 62. The main tap is the tap that is generally associated with the largest tap weight and provides most of the energy in the equalized output signal. As provided above, in the configurations shown in FIGS. 2 and 3 the main tap is the third (of the five) tap locations and falls between filter sections 38, 40 and 72, 74 respectively.

Moreover, FIG. 4 illustrates a differentiator circuit 102 which differentiates the main tap signals to generate differentiated main tap signals on signal path 104. It will be recognized that, to reduce the effects of attenuation, the differentiation operation performed by the differentiator circuit 102 of FIG. 4 could be readily performed by suitable circuitry provided as part of the equalizer filter section located in front of the main tap (i.e., the filter section 38 of FIG. 2 or the filter section 72 of FIG. 3), so that both the main tap signals and the differentiated main tap signals are provided from the equalizer 24; however, for purposes of clarity of discussion, the differentiator circuit 102 has been functionally identified as part of the peak detector circuit 64 in FIG. 4.

Figure 5:
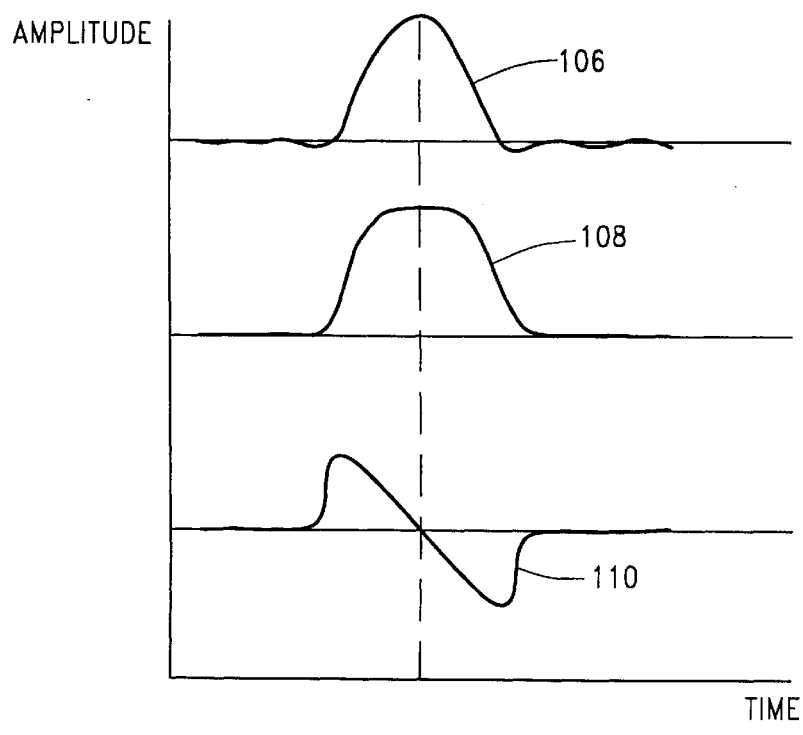
FIG. 5 provides graphical representations of an input readback signal, a main tap signal and a differentiated main tap signal.

Additionally, to further facilitate the discussion of the circuitry of FIG. 4, FIG. 5 has been provided which shows graphical representations of an input readback signal 106, a main tap signal 108 and a differentiated main tap signal 110. As will be recognized, the input readback signal 106 is initially received by the channel 10 from the head 12 in response to a magnetic flux transition on the disc 14. The main tap signal 108 results from the operation of the circuitry of FIG. 1 upon the input readback signal 106 (that is, the operation of the preamplifier 16, the prefilter 18 and the first two stages of the equalizer 24 in amplifying and filtering the input readback signal 106). In turn, the differentiated main tap signal 110 results from the differentiation of the main tap signal 108 by the differentiator circuit 102 of FIG. 4.

As shown in FIG. 4, both the main tap signal 108 and the differentiated main tap signal 110 are shown to be provided to a pair of gated peak detectors 112A, 112B, by way of signal paths 62 and 104, respectively. As will be discussed below, the gated peak detectors 112A, 112B operate to detect the presence of magnetic transition pulses in the recovered sequence and also to determine the timing of these transition pulses.

Figure 6:
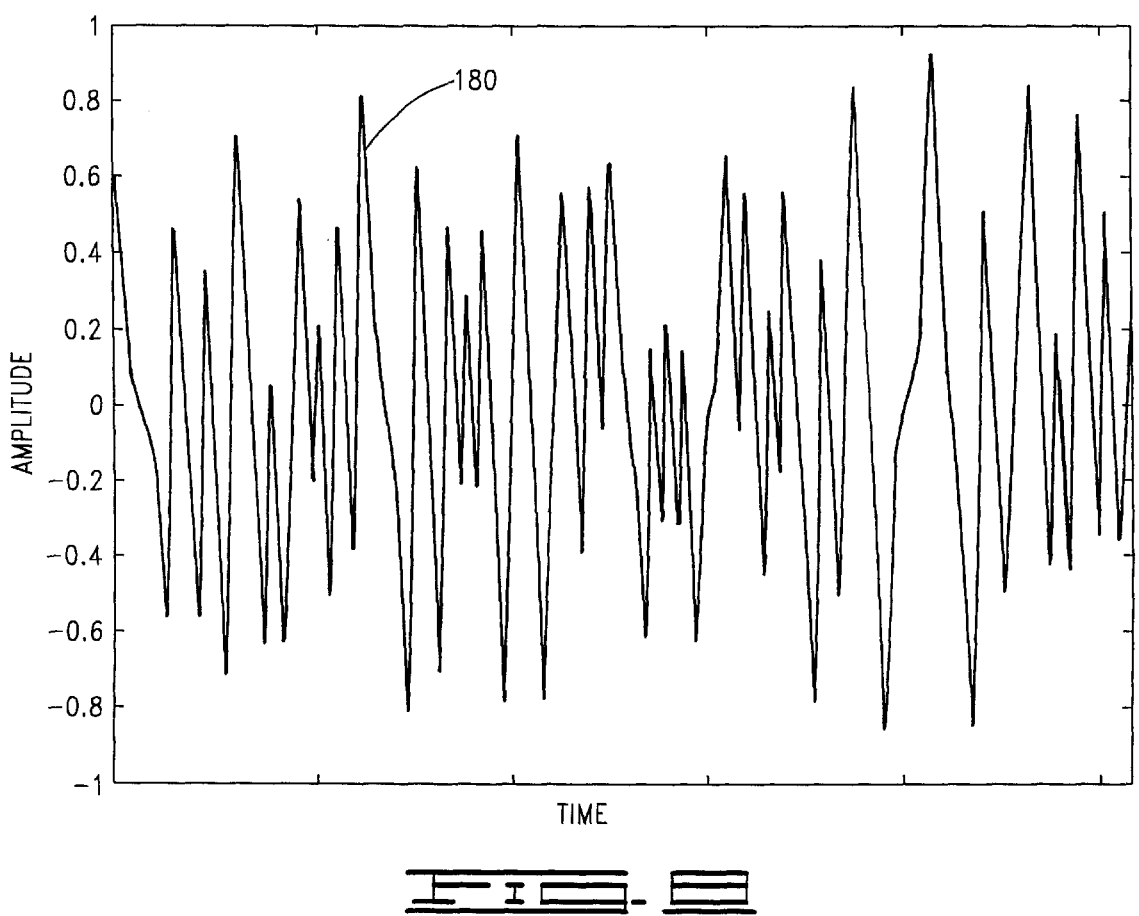
FIG. 6 is a functional block diagram for the gated peak detector of the self-synchronization circuit of FIG. 4.

Turning to FIG. 6, shown therein is a functional block diagram for the gated peak detector 112A. As shown in FIG. 6, the gated peak detector 112A comprises a non-zero threshold comparator 114 which receives the main tap signal 108 from signal path 62, and a zero threshold comparator 116 (with inverting output 117), which receives the differentiated main tap signal 110 from signal path 104.

Figure 7:
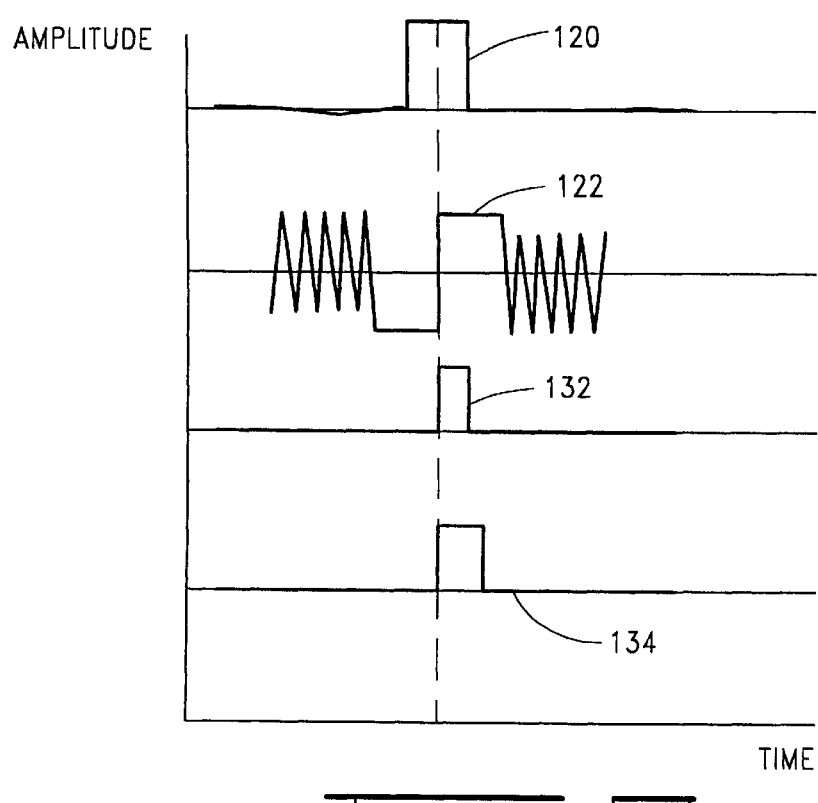
FIG. 7 provides graphical representations of a non-zero threshold signal, a zero threshold signal and gated signals generated by the gated peak detector circuit of FIG. 6 in response to the signals of FIG. 5.
Figure 5:
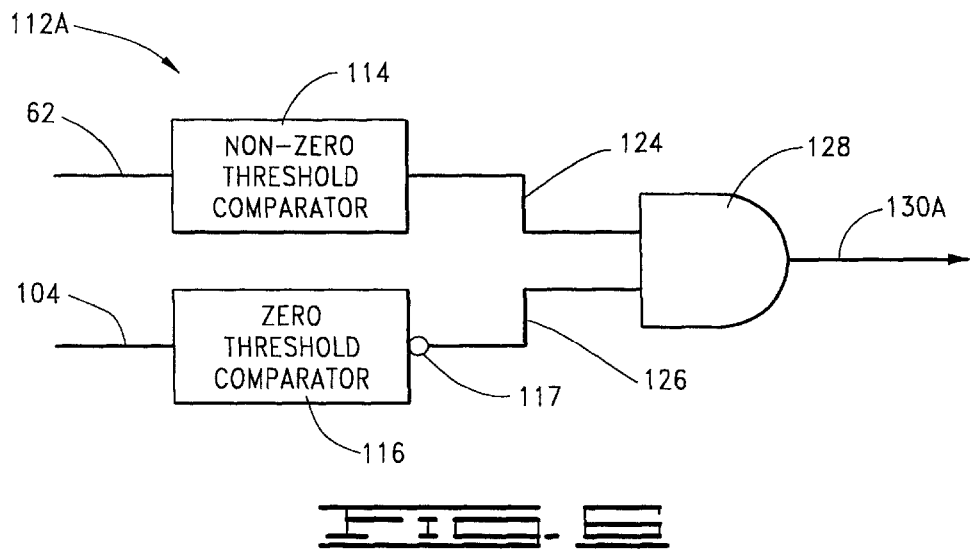

The non-zero threshold comparator 114 accordingly uses a non-zero threshold so that, in response to the main tap signal 108 of FIG. 5, a non-zero threshold signal 120 is generated, as shown in FIG. 7. The non-zero threshold signal 120 takes a maximum value (typically normalized to 1) at such time that the main tap signal 108 exceeds the threshold and the non-zero threshold signal 120 takes a zero value at all other times.

The zero threshold comparator 116 of FIG. 6 uses a zero-value threshold, so that a solid antisymmetric pulse is generated from the original transition pulse. That is, in response to receipt of the differentiated main tap signal 110 of FIG. 5, a zero threshold signal 122 as shown in FIG. 7 is generated, having a zero crossing corresponding in time with the peak of the input readback signal 106 (and noise outside of the antisymmetric pulse).

The outputs from the non-zero threshold comparator 114 and the zero threshold comparator 116 are provided, by way of signal paths 124 and 126, respectively, to an AND gate 128, which outputs on signal path 130A a gated signal 132, as shown in FIG. 7. The gated signal 132 thus represents the input transition; that is, the gated signal 132 has a rising edge corresponding to the peak of the input readback signal 106 without the associated random noise.

It will be recognized that the input readback signal 106 of FIG. 6 represents a magnetic transition of positive polarity; accordingly, the gated peak detector 112A operates to detect such positive transitions from the read head 12. Moreover, the gated peak detector 112B detects magnetic transitions of negative polarity; that is, the gated peak detector 112B has a construction similar to the construction of the gated peak detector 112A as shown in FIG. 6, except that the gated peak detector 112B uses a negative non-zero threshold to detect magnetic transitions of negative polarity, outputting signals such as represented by gated signal 134 shown in FIG. 7 in response to a negative input readback signal (not shown).

The use of the two gated peak detectors 112A, 112B (FIG. 4) has been provided in order to accommodate utilization of codes that, during write mode, can generate adjacent magnetic transitions of opposite polarity in adjacent clock cycles. Thus, the outputs of the gated peak detectors 112A, 112B are provided (by way of signal paths 130A, 130B) to a pair of phase data comparators 136A, 136B, as shown in FIG. 4. It will be recognized that the gated signals 132, 134 provided to the phase data comparators 136A, 136B will be mutually exclusive (that is, only one will be present at any given clock pulse), but it is contemplated that the gated signals 132, 134 could arrive at adjacent clock cycles.

The phase data comparators 136A, 136B receive the gated signals 132, 134 and compare these signals to a square-wave clock signal provided on a signal path 138 by a voltage controlled oscillator (VCO) 140 of the phase locked loop 66. The phase data comparators 136A, 136B thus utilize charge pumps (not separately shown) to generate timing error signals (currents) in response to the VCO signal and to the gated signals 132, 134. One preferred construction for the phase data comparators 136A, 136B is discussed in U.S. Pat. No. 4,754,225 issued Jun. 28, 1988, assigned to the assignee of the present invention and incorporated herein by reference. It will be recognized that each of the phase data comparators 136A, 136B requires two full clock cycles to complete one cycle of operation; thus, the two parallel paths shown in FIG. 4 have been provided to accommodate gated signals 132, 134 arriving on adjacent clock cycles.

The timing error signals generated by the phase data comparators 136A, 136B are output on signal paths 142A, 142B as shown, which converge to a second-order loop filter 144, comprising a capacitor 146 in parallel with a capacitor 148 in series with a resistor 150. The loop filter 144 operates to filter the timing error signals from the phase data comparators 136A, 136B so that the voltage at the output (path 152) of the loop filter 144 controls (and corrects) the frequency and phase of the VCO clock.

The VCO 140 generates two complimentary clock signals, identified in FIG. 4 as "VCO" and "/VCO", with the /VCO signal 180 degrees out of phase with the VCO signal. As will be recognized, selected types of equalization, such as classes PR-IV and EPR-IV employ such complimentary clock signals. Thus, both the VCO and /VCO signals are provided to a multiplexer ("mux") 160, which is selectively controlled by the read channel controller 20 as shown (by way of control bus 162).

The selected signal (VCO or /VCO) is provided by the mux 160 to the programmable timing delay circuit 96, which provides fine delay control of the selected signal (VCO or /VCO) from the VCO 140. Particularly, the timing delay circuit 96 includes a programmable delay which facilitates fine adjustments in the phase of the channel clock, which is output by the timing delay circuit 96 on signal path 166 to the sampler 28 (of FIG. 1) as well as the Viterbi detection circuitry and decoder (not shown) to reconstruct the retrieved data from the samples of the equalized signal.

The programmable delay used by the timing delay circuit 96 is set and controlled by the timing delay calibration circuit 170 during the receipt of sector preamble signals. More particularly, as will be recognized, a special "synchropattern" is customarily written before each sector of data stored on the disc 14. The reading of the synchropattern by the head 12 results in the generation of the sector preamble signals, which comprise, for example, sinusoidal signals used by the channel 10 to lock the VCO 140 in the correct phase and to prepare for the recovery of the data stored in the sector.

During receipt of the sector preamble signals, the read channel controller 20 issues (among other commands on bus 162) two specific commands to calibrate the self-synchronization circuit 11. The first command which is provided to the timing delay calibration circuit 170 enables the process of calibration of the timing delay circuit 96; simultaneously, the second command which is provided to the time-domain equalizer 24 (of FIG. 1) freezes the process of adaptation of tap coefficients in the time domain equalizer 24. Thus, the process of calibration of the subsystem of synchronization and the process of equalization do not interfere with each other. The timing delay calibration circuit 170 will, in response to the samples on signal path 30 (from the sampler 28, as shown in FIG. 1), perform a fine adjustment of the amount of delay used by the timing delay circuit 96 (by way of new delay values provided on signal path 172) until the equalized samples obtain predetermined nominal values (for the preamble). Thereafter, the sector data will be processed using the calibrated delay until the next preamble is encountered.

Having now concluded a discussion of the construction of the self-synchronization circuit 11 of the channel 10, the operation of this circuitry will now be discussed with reference to FIG. 8, which provides a graphical representation of a computer simulated readback signal 180. The readback signal 180 comprises the response of the head 12 to a periodic, 127-bit pseudo-random sequence of maximum length contemplated as having been written to the disc 14. As will be recognized by those skilled in the art, such sequences are useful in characterizing the performance of magnetic recording channels.

During a read operation, the readback signal 180 is amplified in the preamplifier 16 and prefiltered in the prefilter 18 in order to reduce the effects of noise. The prefiltering is contemplated as including high frequency boost in order to compensate for depletion of the high frequency components in the signal as a result of the channel response.

Once filtered, the readback signal 180 is provided to the equalizer 24 wherein the signal 180 undergoes frequency-domain, analog filtering in each of the filter sections (36, 38, 40 and 42 using the equalizer 24 of FIG. 2 or 70, 72, 74 and 76 using the equalizer 24A of FIG. 3). The signals at each of the associated tap locations are thereafter multiplied by tap weight signals and summed to generate equalized output signals (not shown), which are sampled by the sampler 28 (of FIG. 1).

Figure 9:
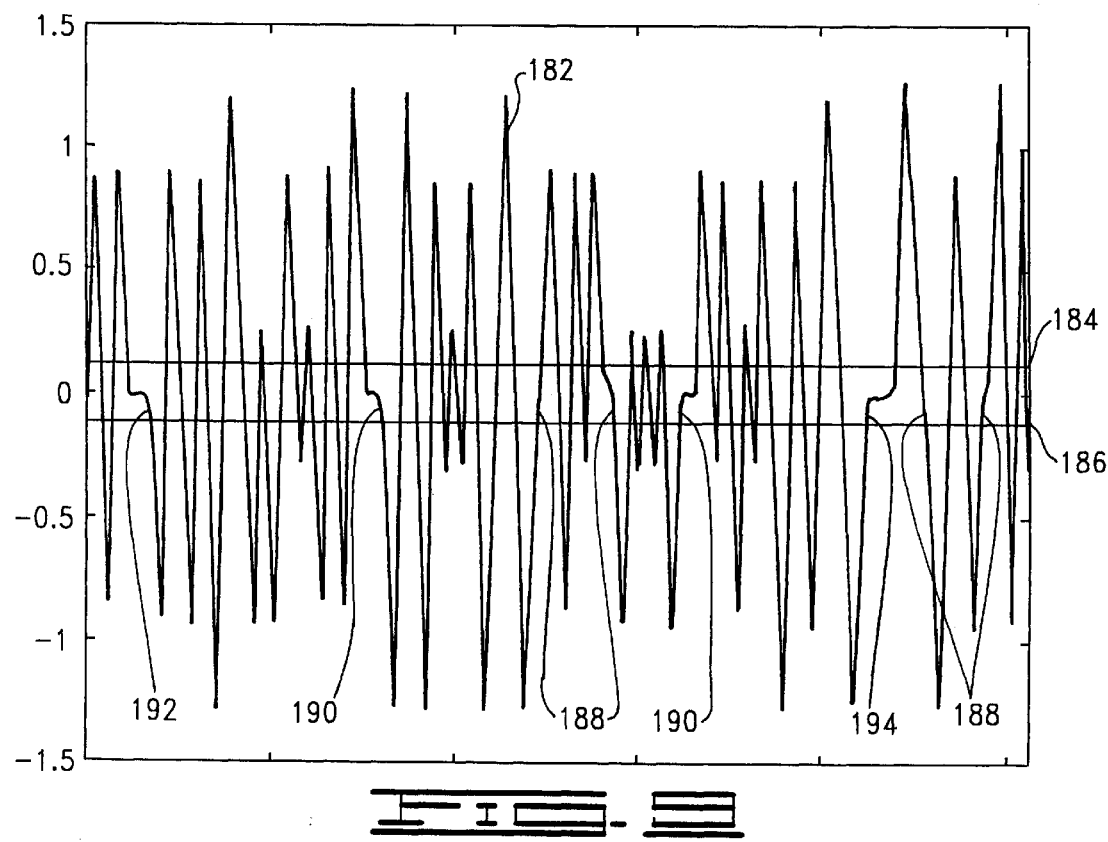
FIG. 9 is a graphical representation of a main tap signal generated in response to the simulated raw readback signal of FIG. 8.

Referring to FIG. 9, shown therein is a graphical representation of a main tap filtered signal 182, generated at the main tap of the equalizer 24 in response to the readback signal 180. As will now be recognized, the main tap filtered signal 182 is used for timing recovery by the self-synchronization circuit 11 and is provided by way of the signal path 62 to the peak detector circuit 64.

As shown in FIG. 9, all of the original peaks in the readback signal 180 are present in the main tap filtered signal 182. These original peaks exceed either a positive threshold level 184 or a negative threshold level 186, with the threshold levels 184, 186 generally corresponding to the non-zero threshold levels used by the gated peak detectors 112A, 112B of the peak detector circuit 64. For reference, relatively "large" intervals between magnetic transitions are identified in FIG. 9, with intervals of 4 T indicated at 188, 5 T indicated at 190, 6 T indicated at 192 and 7 T indicated at 194 ("T" being the period of the channel clock).

Figure 10:
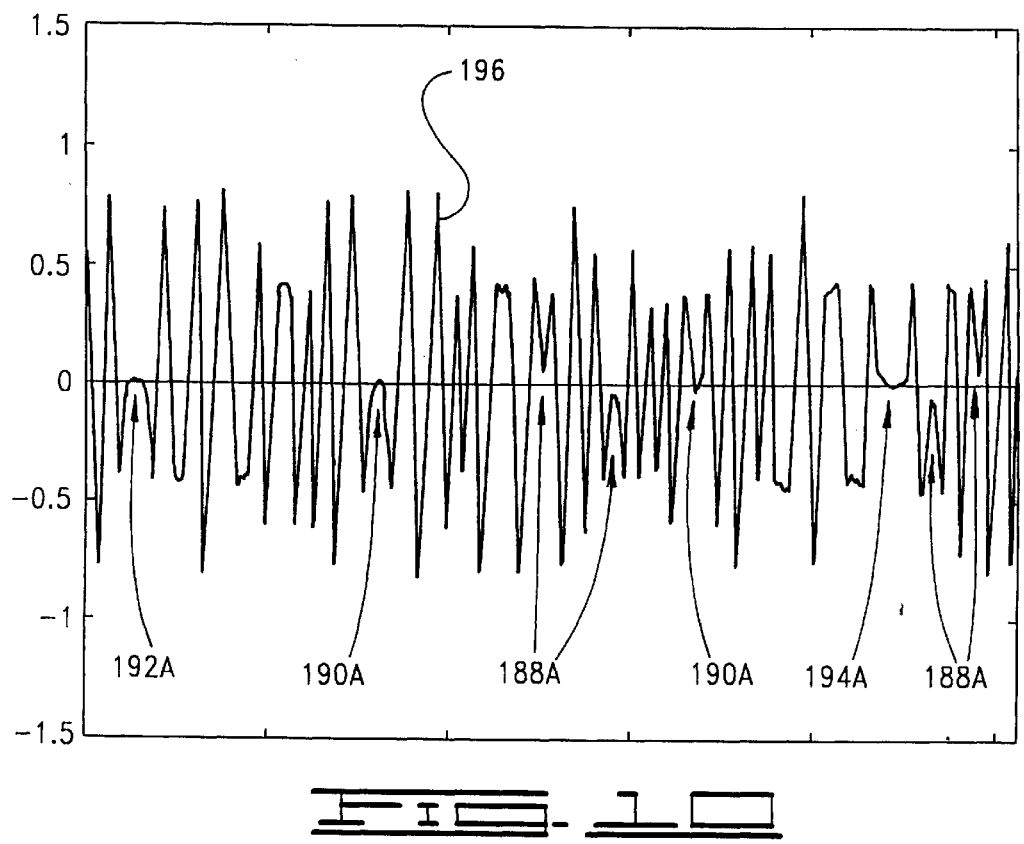
FIG. 10 is a graphical representation of a differentiated main tap signal generated in response to the raw readback signal of FIG. 9.

Additionally, FIG. 10 provides a differentiated main tap signal 196, which as described hereinabove is accomplished through the differentiation of the main tap filtered signal 182. Valid zero crossings of the differentiated main tap signal 196 correspond to magnetic transitions in the readback signal 180 and are used with the main tap signal 182 to control the VCO 140 (and hence, the self-synchronization of the channel 10). Non-valid zero crossings (or near zero crossings), as shown at intervals 188A (4 T), 190A (5 T), 192A (6 T) and 194A (7 T) and corresponding to the intervals 188, 190, 192 and 194 of FIG. 9 will not result in corrections to the VCO 140, as a result of the operation of the peak detector circuit 64. Thus, robust self-synchronization will be achieved by the self-synchronization circuit 11 of the channel 10 through use of the main tap filtered signal 182 and the differentiated main tap signal 196.

Although the magnetic recording channel 10 disclosed herein has been described as being embodied in a disc drive, it will be recognized that the present invention can readily be utilized in other recording channel applications, such as in a magnetic tape drive. Unless otherwise provided, for purposes of the claims below it will be understood that the term "magnetic recording channel" is not limited to disc drive applications.

It will be clear that the present invention is well adapted to carry out the objects and attain the ends and advantages mentioned as well as those inherent therein. While presently preferred embodiments have been described for purposes of this disclosure, numerous changes may be made which will readily suggest themselves to those skilled in the art and which are encompassed in the spirit of the invention disclosed and as defined in the appended claims.

What is claimed is:

1. A magnetic recording channel, comprising:

analog time-domain equalization means for performing analog time-domain equalization of an input signal to an approximation of a selected waveform, the equalization means including:

a plurality of serially connected analog filter sections with associated tap locations, each tap location providing a tap signal, the tap locations including a main tap location and associated main tap signal;

tap weight generation means for generating tap weight signals;

a plurality of analog multipliers, connected to the tap locations, for multiplying the tap signals by the tap weight signals to generate product signals; and analog summing means, responsive to the analog multipliers, for summing the product signals to generate an equalized output signal;

sampling means, responsive to the equalization means, for sampling the equalized output signal; and self-synchronization means, responsive to the equalization means, for synchronizing the rate of data recovery by the magnetic recording channel, the self-synchronization means including:

differentiation means, responsive to the main tap signal, for differentiating the main tap signal to generate a differentiated main tap signal;

timing means for providing a sampling clock signal to the sampling means; and peak detection means, responsive to the main tap signal and the differentiated main tap signal, for detecting magnetic transitions in the input signal and using the detected magnetic transitions to control the timing means.

2. The magnetic recording channel of claim 1, wherein the timing means comprises:

a phase locked loop including a voltage controlled oscillator generating a vco output clock signal;

a programmable timing delay circuit, responsive to the voltage controlled oscillator, for delaying the vco output clock signal in accordance with a programmable delay value to generate the sampling clock signal; and a timing delay calibration circuit, connected to the programmable delay circuit and the sampling means, for generating the programmable delay value in response to the receipt of sector preamble signals by the magnetic recording channel;

wherein the phase locked loop is controlled by the peak detection means.

3. The magnetic recording channel of claim 2, wherein the peak detection means comprises:
   a gated peak detector, comprising:
      a non-zero threshold comparator responsive to the main tap signal;
      a zero threshold comparator responsive to the differentiated main tap signal;
      an AND gate responsive to the non-zero threshold comparator and the zero threshold comparator to generate a gated peak signal indicative of the presence and timing of the magnetic transition in the readback signal; and
   a phase data comparator, responsive to the gated peak detector and the voltage controlled oscillator, for generating a timing error signal from the difference between the vco clock signal and the gated peak signal, wherein the timing error signal adjusts the frequency and phase of the vco clock signal generated by the voltage controlled oscillator.

4. In a disc drive of the type having a rotatable magnetic storage disc and an actuator adjacent the disc, the actuator including a head for the selective magnetization of the disc to store data on the disc and for the generation of a readback signal having peaks indicative of magnetic transitions in the data stored on the disc, an improved recording channel for the reconstruction of the stored data from the readback signal comprising:
   a time-domain equalizer, responsive to the readback signal, for filtering the readback signal to an approximation of a waveform of a selected class of partial response signaling, the time-domain equalizer including:
      serially-connected analog filter sections having associated tap locations;
      analog multipliers, connected to the tap locations, for multiplying tap signals from the tap locations by tap weight signals to generate product signals;
      an analog summer, connected to the multipliers, for generating an equalized output signal from the product signals;
   a sampler circuit, connected to the analog summer, for sampling the equalized output signal;
   a voltage controlled oscillator for generating a vco clock signal;
   a detector circuit, responsive to a selected tap signal from a selected tap location, for detecting the timing of a peak in the readback signal indicative of a magnetic transition on the disc, the detector circuit comprising:
      a differentiator for differentiating the selected tap signal from the selected tap location to generate a differentiated tap signal;
      a gated peak detector, comprising:
         a non-zero threshold comparator responsive to the selected tap signal;
         a zero threshold comparator responsive to the differentiated tap signal;
         an AND gate responsive to the non-zero threshold comparator and the zero threshold comparator to generate a gated signal indicative of the presence and timing of the peak in the readback signal; and
      a phase data comparator, responsive to the gated peak detector and the voltage controlled oscillator, for generating a timing error signal from the difference between the vco clock signal and the gated signal, wherein the timing error signal adjusts the frequency of the vco clock signal generated by the voltage controlled oscillator;
   a timing delay circuit, responsive to the vco clock signal, for generating a clock signal used by the sampler circuit to time the sampling of the equalized output signal, the timing delay circuit including a programmable delay so that the clock signal generated by the delay circuit comprises the vco clock signal adjusted in time by an amount equal to the programmable delay; and
   a timing delay calibration circuit, connected to the timing delay circuit and the sampler circuit, for adjusting the programmable delay used by the timing delay circuit in response to samples provided by the sampler circuit.

5. The improved recording channel of claim 4, wherein the selected tap location is the main tap location of the equalizer, the selected tap signal is the main tap signal and the differentiated tap signal is generated by the differentiation of the main tap signal.

6. The improved recording channel of claim 4, wherein the data stored on the disc is stored in sectors having sector preamble information at the beginning of the each sector so that the head generates a sector preamble signal as the sector preamble information for each sector is read, and wherein the timing delay calibration circuit adjusts the programmable delay used by the timing delay circuit during receipt of the sector preamble signal.

7. In a magnetic recording channel wherein data is recovered from a magnetic medium through the detection of flux transitions in the magnetization of the medium, a method for self-synchronizing the rate of data recovery by the magnetic recording channel, comprising the steps of:
   generating an equalized output signal by filtering a readback signal to an approximation of a selected waveform, the readback signal indicative of the magnetization of the medium, comprising the steps of:
      sequentially filtering the readback signal in a plurality of serially connected analog filter sections having associated tap locations, including a main tap location;
      multiplying tap signals from the tap locations by tap weight signals to generate product signals;
      summing the product signals to obtain the equalized output signal;
   differentiating the main tap signal from the main tap location to generate a differentiated main tap signal;
   generating a gated signal from the main tap signal and the differentiated main tap signal, the gated signal having a rising edge corresponding to a peak in the readback signal indicative of the presence and the timing of a magnetic transition;
   generating a vco clock signal having a controllably selectable frequency;
   comparing the vco clock signal to the gated signal to generate a timing error signal;
   adjusting the frequency of the vco clock signal using the timing error signal; and
   delaying the vco clock signal by a programmable amount of delay to generate a channel clock used by the magnetic recording channel for the recovery of the data stored on the medium from the equalized output signal.

8. In a disc drive of the type having a rotatable magnetic storage disc and an actuator adjacent the disc, the actuator including a head for the selective magnetization of the disc to store data on the disc and for the generation of a readback signal having peaks indicative of magnetic transitions in the data stored on the disc, the disc drive further including a magnetic recording channel for reconstructing the stored data from the readback signal, a method for self-synchronizing the rate of data recovery by the recording channel, comprising:

generating an equalized output signal by filtering the readback signal to an approximation of a selected waveform, comprising the steps of:

sequentially filtering the readback signal in a plurality of serially connected analog filter sections having associated tap locations, including a main tap location;

multiplying tap signals from the tap locations by tap weight signals to generate product signals;

summing the product signals to obtain the equalized output signal;

differentiating the main tap signal from the main tap location to generate a differentiated main tap signal;

generating a gated signal from the main tap signal and the differentiated main tap signal, the gated signal having a rising edge corresponding to a peak in the readback signal indicative of the presence and the timing of a magnetic transition;

generating a vco clock signal having a controllably selectable frequency;

comparing the vco clock signal to the gated signal to generate a timing error signal;

adjusting the frequency of the vco clock signal using the timing error signal; and delaying the vco clock signal by a programmable amount of delay to generate a channel clock used by the magnetic recording channel for the recovery of the data stored on the disc from the equalized output signal.

9. The method of claim 8, wherein the data stored on the disc is stored in sectors having sector preamble information at the beginning of the each sector so that the head generates a sector preamble signal as the sector preamble information for each sector is read, and wherein the method further comprises the steps of adjusting the programmable delay during receipt of the sector preamble signal.

10. A communication channel, comprising:

a data recovery channel for maximum likelihood detection of an input signal, the data recovery channel comprising a time domain equalizer which generates an equalized signal by filtering the input signal to an approximation of a selected waveform, the time domain equalizer comprising a plurality of serially connected filter sections and a plurality of associated tap locations disposed between adjacent filter sections; and a clock recovery channel, operably coupled to a selected tap location, which generates timing signals in response to tap signals at the selected tap location.

11. The communication channel of claim 10, wherein the data recovery channel further comprises:

a sampling circuit, operably coupled to the time domain equalizer and the clock recovery channel, which samples the equalized signal generated by the time domain equalizer in response to the timing signals generated by the clock recovery channel.

12. The communication channel of claim 10, wherein the clock recovery channel comprises:

a clock circuit, operably coupled to the sampling circuit, which generates the timing signals; and a peak detector circuit, operably coupled to the clock circuit and the selected tap location, which controls the generation of the timing signals by the clock circuit in response to detected peaks in the tap signals from the selected tap location.

13. The communication channel of claim 12, wherein the peak detector circuit comprises a differentiator circuit which differentiates the tap signals from the selected tap location.

* * * * *